US005825117A

United States Patent [19]

Ossmann et al.

[11] Patent Number: 5,825,117

[45] Date of Patent: Oct. 20, 1998

[54] SECOND HARMONIC IMAGING TRANSDUCERS

[75] Inventors: William J. Ossmann, Acton, Mass.; Larry Pendergrass, Santa Rosa, Calif.; Martin K. Mason, Andover, Mass.

[73] Assignee: Hewlett-Packard Company, Palo Alto, Calif.

[21] Appl. No.: 622,483

[22] Filed: Mar. 26, 1996

[51] Int. Cl.[6] .................................................... H01L 41/08

[52] U.S. Cl. .......................... 310/317; 310/319; 310/334; 310/366

[58] Field of Search .................................... 310/316, 317, 310/319, 366, 334–337

[56] References Cited

U.S. PATENT DOCUMENTS

| | | | |
|---|---|---|---|
| 4,096,756 | 6/1978 | Alphonse | 310/334 X |
| 4,344,159 | 8/1982 | Ballinger | 310/336 X |
| 4,354,132 | 10/1982 | Borburgh et al. | 310/334 |
| 4,870,972 | 10/1989 | Maerfeld et al. | 310/336 X |
| 5,329,498 | 7/1994 | Greenstein | 310/334 X |
| 5,381,067 | 1/1995 | Greenstein et al. | 310/334 |
| 5,381,385 | 1/1995 | Greenstein | 310/334 X |
| 5,410,205 | 4/1995 | Guruaja | 310/328 |
| 5,438,554 | 8/1995 | Seyed-Bolorforosh et al. | 310/334 X |

*Primary Examiner*—Mark O Budd
*Attorney, Agent, or Firm*—Pamela Lau Kee

[57] ABSTRACT

A harmonic imaging transducer is a structure of two mechanically coupled piezoelectric layers. This two-layer piezoelectric structure may vibrate either in a symmetric mode, wherein the two layers are expanding and contracting in unison, or in an anti-symmetric mode, wherein one layer is contracting while the other is expanding. Symmetric mode vibrations result in first harmonic operation, while anti-symmetric mode vibrations result in second harmonic operation.

8 Claims, 5 Drawing Sheets

SECOND HARMONIC IMAGING TRANSDUCERS

FIELD OF THE INVENTION

The invention is directed toward medical image processing and particularly towards a transducer that transmits at a first harmonic and receives predominantly at a second harmonic.

BACKGROUND OF THE INVENTION

Ultrasonic transducers are used in a variety of applications where it is desirable to view the interior of an object with a minimum degree of invasion. For example, in medical applications, much diagnostic information may be obtained from an ultrasonic image of the interior of a human body. Thus, ultrasonic imaging equipment, including ultrasonic probes and associated image processing equipment, has found widespread medical use.

In some medical applications of ultrasound, imaging of the blood may be enhanced by the injection of a contrast agent consisting of microscopic bubbles or particles. Some contrast agents have the property that when insonified at a particular frequency, f, they re-radiate a strong signal at the second harmonic of that frequency, 2f. Since this second harmonic frequency is separated from normal tissue echoes, the image contrast between tissue that is perfused with blood and tissue that is unperfused is enhanced by frequency selective filtering and processing. This is known as second harmonic imaging.

One obstacle to using contrast agents for second harmonic imaging is the suppression of transmit energy at the second harmonic frequency from a transducer that is capable of receiving at that frequency. A conventional ultrasound transducer capable of receiving the second harmonic, 2f, also will transmit a strong signal at 2f. This is a problem, since reflections from both perfused and unperfused tissue will occur from this 2f frequency. Any harmonic frequency energy that is transmitted will produce tissue echoes at that frequency which will reduce the contrast with the second harmonic produced by the bubbles.

Attempting second harmonic imaging without specialized transducers poses several problems. First, a very wideband transducer must be used so as to be responsive at both the first and second harmonic. However, transducers of the required bandwidth are difficult to design and build, especially without a penalty in sensitivity. This is particularly true for small elements needed for sector probes. Also, having built such a probe, the second harmonic frequency must be suppressed on transmit. Some additional suppression is realized by differential tissue attenuation on transmit between high and low frequencies, but this is less effective at shallower depth.

Alternatively, a probe could incorporate separate transmit and receive sections, each optimized for different frequencies. Since the dimensions of the transducer elements of such a probe would vary greatly, this would be expensive to build, requiring complicated assembly to tight mechanical tolerances.

It would be desirable to build a second harmonic imaging transducer that is easy to manufacture and also able to be operated as a standard imaging probe with full aperture.

SUMMARY OF THE INVENTION

A harmonic imaging transducer is a structure of two mechanically coupled piezoelectric layers. This two-layer piezoelectric structure may vibrate either in a symmetric mode, wherein the two layers are expanding and contracting in unison, or in an anti-symmetric mode, wherein one layer is contracting while the other is expanding. Symmetric mode vibrations result in first harmonic operation, while anti-symmetric mode vibrations result in second harmonic operation.

A backing is positioned adjacent to a piezoelectric structure that may include a first and a second layer of piezoelectric material interposed by at least one electrode. One or more acoustic matching layers are positioned over the piezoelectric structure. A switch is connected to the piezoelectric structure such that the transducer operates at the first harmonic when the switch is closed, and at the second harmonic when the switch is open. In a preferred embodiment, the switch consists of two diodes connected in parallel with opposite polarity, so that the strong transmit signals cause the diodes to conduct resulting in first harmonic operation, but the receive signals are not strong enough to cause the diodes to conduct, enabling receipt of the second harmonic as well as the first.

DETAILED DESCRIPTION OF THE PREFERRED EMBODIMENTS

An ultrasonic transducer is a structure of two mechanically coupled piezoelectric layers. This two-layer piezoelectric structure may vibrate either in a symmetric mode, when the two layers expand and contract in unison, or in an anti-symmetric mode, when one layer contracts while the other expands. Symmetric mode vibrations result in first harmonic operation, while anti-symmetric mode vibrations result in second harmonic operation.

This ultrasonic transducer transmits preferentially at the first harmonic and is capable of receiving the second harmonic. The layers of piezoelectric material are interposed by conductive contact layers (electrodes). The electrodes are connected to associated electronic components, signals, and ground leads from the ultrasound system.

Figure 1:
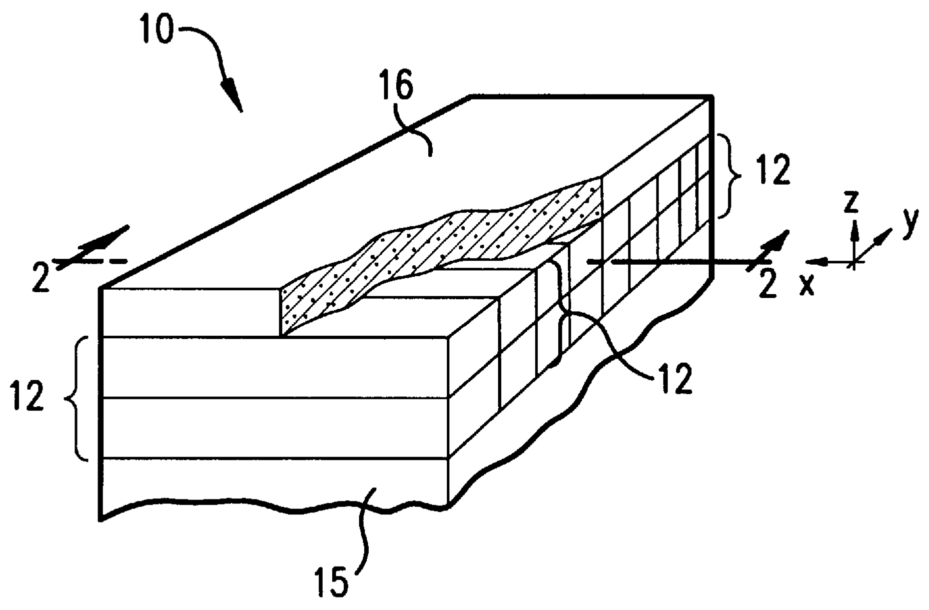
FIG. 1 illustrates a general construction of a transducer array.

FIG. 1 illustrates the general construction of a transducer array 10. The transducer array 10 includes a series of piezoelectric elements 12 disposed side-by-side on a backing 15. The backing 15 may be a damping layer with an appropriate acoustic impedance to optimize the sensitivity, bandwidth or pulse length of the transducer. Typical arrays may include tens to hundreds of elements, each 100–600 microns wide in the y-direction. Each piezoelectric element $12_N$ is typically between 0.5 and 2 cm long in the x-direction. The elements are physically separated so that they can be individually energized. Depending upon the frequencies of the operation of the array, the elements may be 0.1–2 mm high in the z-direction. Such elements may operate at frequencies from the low MHZ to the tens of MHZ. A typical array is between 1 and 6 cm long for a wide range of medical applications, but other applications may call for dimensions outside the disclosed ranges, which may be readily calculated by those skilled in the art. The series of piezoelectric elements 12 may be covered with an impedance matching layer 16.

Alternatively, the elements may be a composite of ceramic piezoelectric material in a polymer matrix or may be a non-ceramic piezoelectric material instead of a single ceramic material. Many suitable types of piezoelectric material are known to those skilled in the art.

Figure 2:
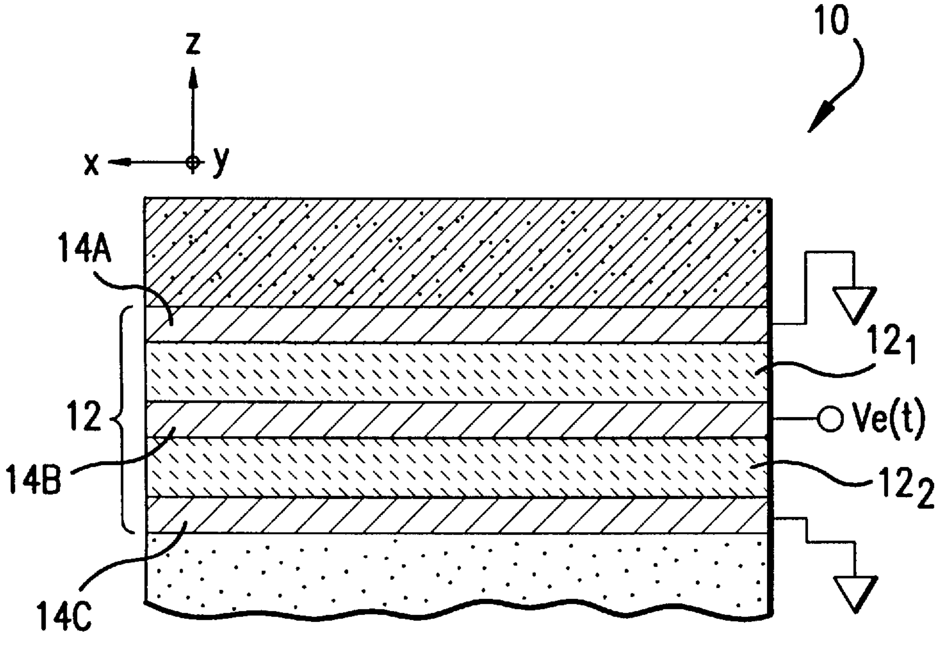
FIG. 2 illustrates a cross-sectional view of the transducer array shown in FIG. 1.

FIG. 2 illustrates a cross-sectional view of the transducer array 10 shown in FIG. 1. The series of piezoelectric elements 12, including two layers of piezoelectric material $12_1$, $12_2$ is interposed by a series of conductive electrical layers 14. One of the piezoelectric layers $12_1$ is positioned between conductive electrical contact layers 14A, 14B while the other piezoelectric layer $12_2$ is positioned between the conductive electrical contact layers 14B, 14C. The electrical contact layer 14B that is positioned between the two layers of piezoelectric material $12_1$, $12_2$ is sufficiently thin that ultrasonic vibrations are mechanically coupled between the two layers of piezoelectric material.

This transducer array may vibrate in two different resonant modes which produce two different frequencies. In the symmetric mode of vibration, the upper and lower piezoelectric layers are expanding and contracting in unison, and the array resonates in the same manner as a single layer whose thickness is the sum of the thicknesses of the two layers. This mode exhibits a thickness mode resonance at a frequency F1 determined by:

$$F1 = \frac{v}{4^*h}$$

where v is the velocity of sound in the layers, and h is the height (thickness) of each layer in the z-direction.

In the anti-symmetric mode of vibration, the vibrations in the two layers are in anti-phase with each other so that the lower piezoelectric layer is contracting while the upper layer is expanding, and expanding while the upper layer is contracting. As a result, the resonance frequency, F2, of this mode is determined by:

$$F2 = \frac{v}{2^*h}$$

It is clear from the equations describing F1 and F2 that F2 is two times F1.

The above description relates to the case where the thicknesses of the piezoelectric layers are equal. By selecting different thicknesses for the piezoelectric layers or using even multiples of piezoelectric layers, the ratios of the two resonance frequencies may be varied. Many variations, for example in size and applications of these transducers will be apparent to those skilled in the art. It will be understood that the resonance frequency of the transducer determines the frequency at which ultrasonic energy is transmitted by the transducer and the frequency at which ultrasonic energy is received by the transducer and converted to an electrical signal.

Calculation of the thicknesses required to generate desired thickness mode resonant frequencies are well within the ability of those skilled in the art. The frequency of an acoustic wave $F=v/\lambda$, where v is the velocity of sound in the medium carrying the acoustic wave and the $\lambda$ is the wavelength of a wave of frequency F in the medium. Furthermore, if F is set to the thickness mode resonant frequency of the medium carrying the acoustic wave, then $F=(c/\rho)^{1/2}/2h$, where c is the stiffness of the resonant body, $\rho$ is the density of the resonant body, and h is the height of the resonant body. By starting with the material properties of the medium, one may calculate the thicknesses required to generate any desired resonant frequency. Applying the above equation and transmission line theory to the array shown in FIGS. 1 and 2 generates any desired set of resonance frequencies.

Construction of the multi-layered arrays may be accomplished by any one or combination of known ceramic or ceramic composite processing techniques. The described construction method begins with either the preparation of a ceramic wafer or a ceramic composite wafer whose thickness equals the thickness of one layer of the desired structure. The desired electrical contact layers may then be vacuum deposited, sputtered or screen printed onto that wafer. Additional wafers and electrical contact layers may be bonded to this basic structure in an acoustically matched manner, also using conventional techniques known to those skilled in the art.

Although the specific embodiment described has the form of a phased array or a linear array, any number of elements suitable to a particular transducer type and application may be used. For example, transducers are often built using but a single transducer element. The behavior and construction of such an isolated element is the same as described above with respect to each element of a phased array or a linear array.

The frequencies of the acoustical resonances of a transducer are determined by the frequencies of the symmetric and anti-symmetric vibrational modes as described above. However, whether a particular frequency is coupled to the transmit and receive electrical signals is determined by the details of the electrical connections and the orientation of the polarization vectors of the piezoelectric layers. These may be arranged to couple only to one mode or to the other or to a superposition of the two modes. If the electrical connections include a switching element, the transducer can be made to operate in one mode when the switch is open and another mode when the switch is closed.

Typical switching elements would include diodes, field effect transistors, varistors, and zener diodes. Several of the embodiments described below have the desirable property that the switching is done automatically in response to the relative levels of the transmit and receive signals without requiring a separate control signal for the switches. Alternatively, a transducer may comprise elements of identical physical dimensions, but with a portion of the elements connected for operation at F1 and the remainder connected for operation at F2. FIGS. 3–6 address a second harmonic imaging transducer having elements that switch between first and second harmonic operation. FIGS. 7–8 address second harmonic imaging transducers comprising separate sets of first and second harmonic elements.

Figure 3A:
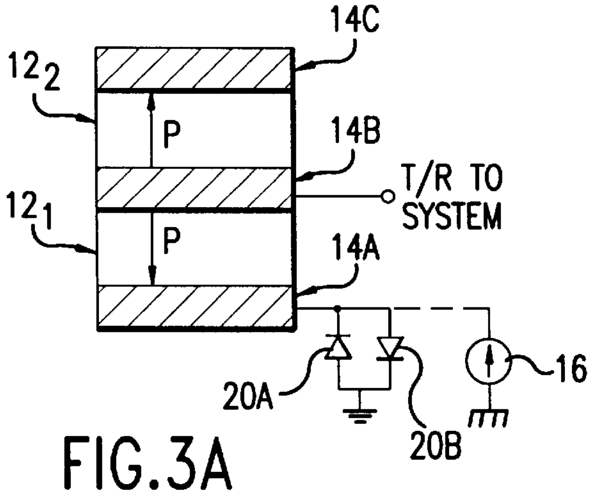
FIGS. 3A–D illustrate embodiments of a second harmonic imaging transducer.

FIGS. 3A–D illustrate second harmonic imaging transducers having passive switching elements. In FIG. 3A, the lower electrical contact layer 14A is isolated by a pair of diodes 20A, 20B. These diodes 20A, 20B conduct under the high signal levels on transmit and electrically connect the lower electrical contact layer 14A to ground. On receive, the electrical signals are not strong enough to cause the diodes to conduct, so the lower piezoelectric layer is not coupled electrically. As a result, both the symmetric and anti-symmetric modes of vibration are coupled to the receive circuit, and the transducer receives efficiently at both F1 and F2.

An optional current source 16 may be placed in parallel with the pair of diodes 20A, 20B. Then when it is desirable to suppress F2 on receive and have identical transmit and receive characteristics, a bias current may be supplied to turn on one of the diodes 20A, 20B through the junction between the diodes 20A, 20B and the lower electrical contact layer 14A. As a result, the excitation of both piezoelectric layers is the same and the symmetric mode of vibration is coupled preferentially. This causes the transducer to transmit and receive both at the lower frequency F1. Electronic switching of the bias current may be performed by techniques well known to those skilled in the art.

Figure 3B:
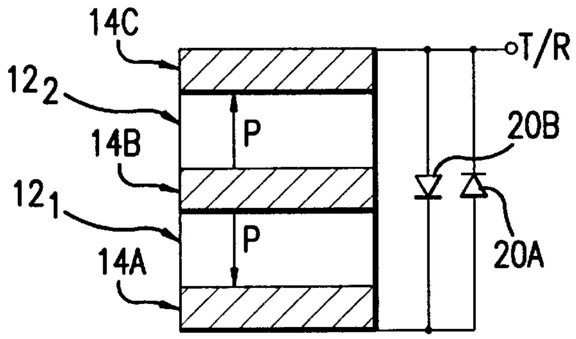

FIG. 3B shows a minor variation on FIG. 3A in which the signal and ground designations of the electrical contact layers are reversed. The operation is the same as in FIG. 3A.

Figure 3C:
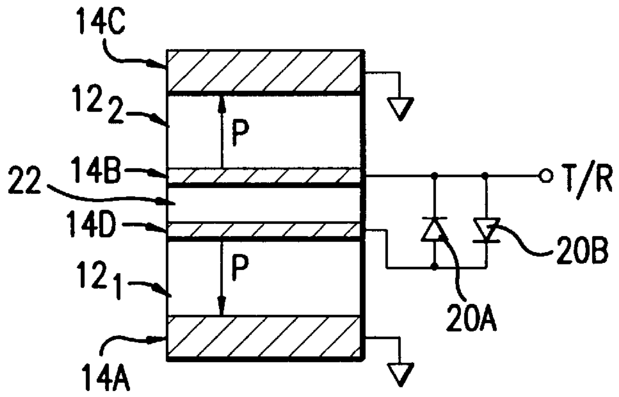

In FIG. 3C, a fourth electrical contact layer 14D and an electrically insulating layer 22 interpose the lower piezoelectric layer 14A and the middle electrical contact layer 14B. These layers must be thin enough to preserve the acoustic coupling between the piezoelectric layers. The diodes 20A, 20B are connected between the middle and the fourth electrical contact layers 14B, 14D and the lower electrical contact layer 14A is connected to the circuit ground. In operation, this behaves in the same manner as the transducers of FIGS. 3A–B.

Figure 3D:
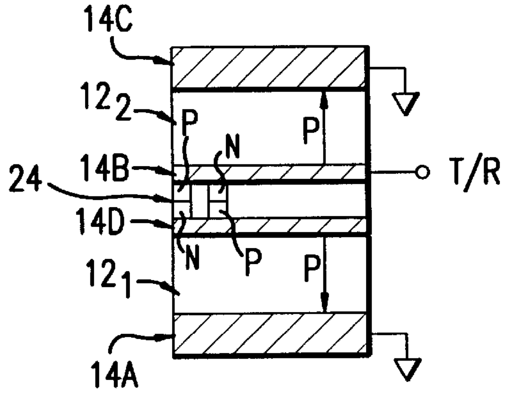

FIG. 3D is similar to FIG. 3C, except that the insulating layer and diodes have been replaced by a thin layer of silicon 24 in which p-type and n-type regions have been fabricated so as to form an array of diodes connecting the middle and the fourth electrical contact layers. The operation is identical to that of FIG. 3C, but fabrication is simpler, since fewer external electrical connections to the contact layers need to be made.

Alternatively, the layer of silicon may be replaced by a thin layer of zinc oxide. When fabricated in the appropriate manner, zinc oxide acts as a varistor, conducting bilaterally when subjected to high voltages, but remaining an insulator under low voltage conditions. This property of zinc oxide allows it to be substituted for the layer of silicon in the embodiment of FIG. 3D.

Figure 4A:
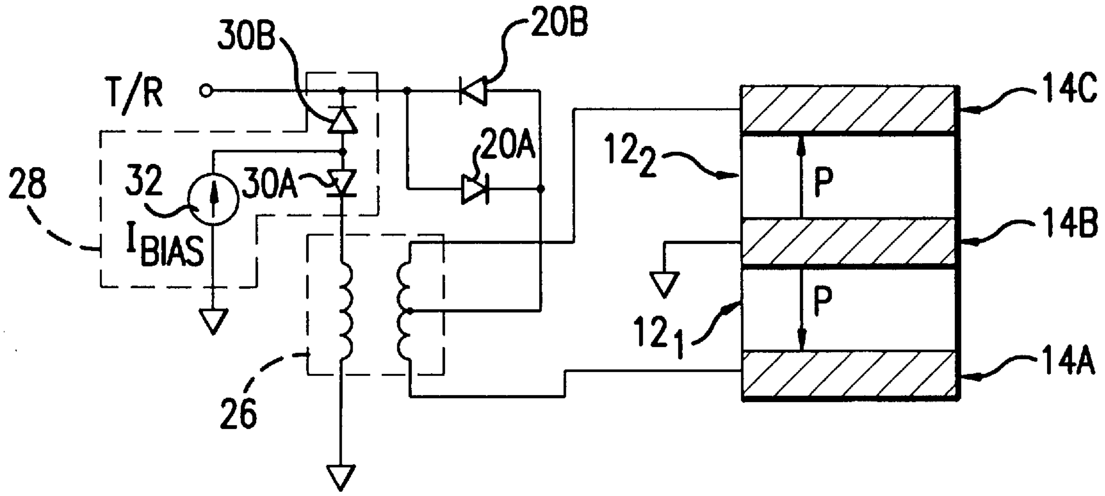
FIGS. 4A–B illustrate an alternate embodiment for the second harmonic imaging transducer.
Figure 4B:
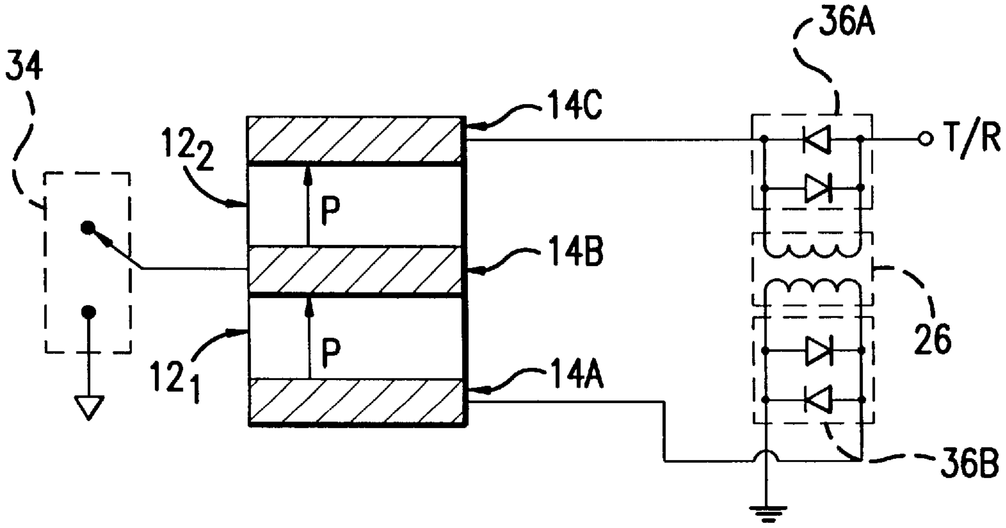

When it is desirable to suppress the first harmonic, F1, on receive, a transformer or a differential amplifier may be used. Two possible methods of using a transformer 26 for switching between f and 2f modes are shown in FIGS. 4A–B. In FIG. 4A, the upper and lower electrical contact layers 14A, 14C are connected to the secondary winding of the transformer 26, and the middle contact layer 14B is grounded. The transmit/receive line is connected to the center tap of the secondary winding of the transformer 26 through a pair of diodes of opposite polarity connected in parallel, and to the primary of the transformer through a switch circuit.

A switch circuit 28 consisting of two diodes 30A, 30B and a source of bias current 32 is shown, but other means may be used. The switch circuit 28 must be turned off during transmit and turned on during receive. This particular switch circuit 28 shown in FIG. 4A has the advantage that the strong transmit signal will turn it off automatically without a separate control signal being applied. The piezoelectric layers $\mathbf{12}_1$, $\mathbf{12}_2$ are polarized in such a manner as to couple common mode (same polarity) electrical signals on the upper and lower electrical contact layers to symmetric mode vibrations, and differential mode (opposite polarity) electrical signals to anti-symmetric mode vibrations. The two diodes 20A, 20B connected between the transmit/receive line and the center tap of the secondary winding of the transformer 26 conduct under the strong signals of transmit, resulting in a common mode electrical excitation, and so the symmetric mode of vibration is excited which has a resonant frequency F1. On receive, the signals are not strong enough to cause the diodes 20A, 20B on the secondary side to conduct. But the switch circuit 28 on the primary side is turned on during receive, so it will be recognized that the transformer 26 is connected in such manner as to couple only the differential mode receive signals resulting from the anti-symmetric mode of vibration at frequency F2, but not the common mode receive signals resulting from the symmetric mode of vibration at frequency F1.

In FIG. 4B, the direction of polarization of one of the piezoelectric layers has been reversed. In this case, the symmetric mode vibrations are coupled to differential mode electrical signals, and the anti-symmetric mode vibrations are coupled to common mode electrical signals. The middle electrical contact layer 14B is connected to ground through a switch 34 that is turned off during transmit and turned on during receive. This switch may be similar to that shown in FIG. 4A. The upper contact layer 14C is connected to the transmit/receive line through one winding of a transformer 26, and the lower contact layer 14A is connected to ground through the other winding of the transformer 26. The turns ratio of the transformer is 1:1, and the connections are such that common mode signals are passed, while differential mode signals are suppressed. Two sets of diodes 36A, 36B are connected electrically in parallel with the windings of the transformer. These diodes 36A, 36B conduct under the high signal conditions of transmit, bypassing the transformer, and exciting the transducer element with a differential mode electrical signal which, in this case, couples to the symmetric mode of vibration having a resonant frequency F1. Common mode electrical signals on transmit, which would excite frequency F2, are suppressed by keeping the switch connected to the middle contact layer open. On receive, this switch 34 is closed, and vibrations at frequency F2, which result in common mode receive electrical signals, are passed through the transformer to the receive line. Received vibrations at frequency F1 result in differential mode electrical signals which are suppressed by the action of the transformer, since the receive signals are too weak to turn on the diodes.

Figure 5:
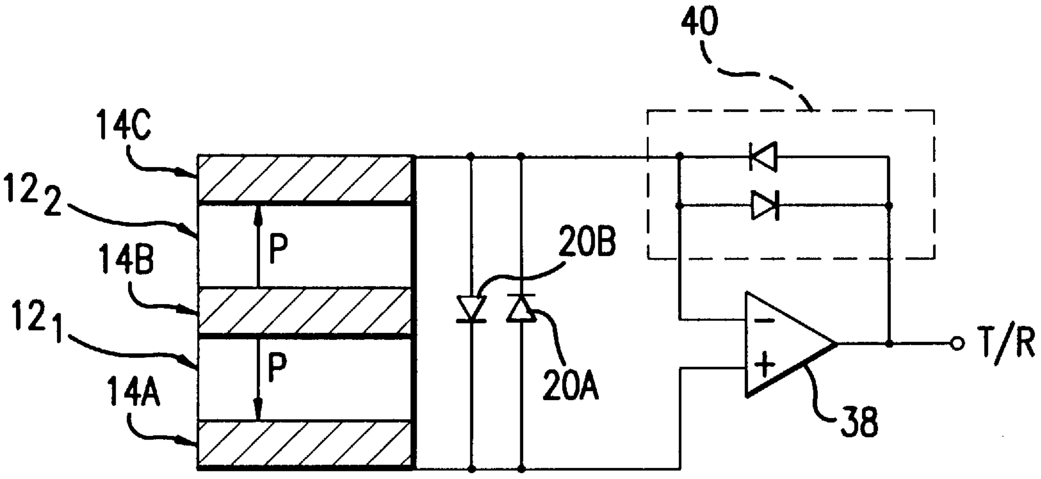
FIG. 5 illustrates an alternate embodiment for the second harmonic imaging transducer.

FIG. 5 illustrates a second harmonic imaging transducer using a differential amplifier 38 to suppress receipt of the first harmonic. The transducer is the same as that illustrated in FIG. 3B with the addition of the differential amplifier 38 and a second pair of diodes 40. This second pair of diodes 40 conducts under the high signal conditions of transmit, causing the transmit signals to bypass the amplifier 38 and resulting in transmit operation that is the same as the embodiment of FIG. 3B—only the frequency F1 is transmitted and the frequency F2 is suppressed. On receive, the signals are not strong enough to cause the diodes to conduct. The symmetric mode vibrations caused by receiving echoes at frequency F1 induce common mode voltages on the upper and lower contact layers 14A, 14C, while the antisymmetric mode vibrations caused by receiving echoes at frequency F2 induce differential mode voltages on the upper and lower contact layers 14A, 14C. The differential amplifier 38 passes only the differential mode voltages, so only the frequency F2 is received, while F1 is suppressed.

Figure 6:
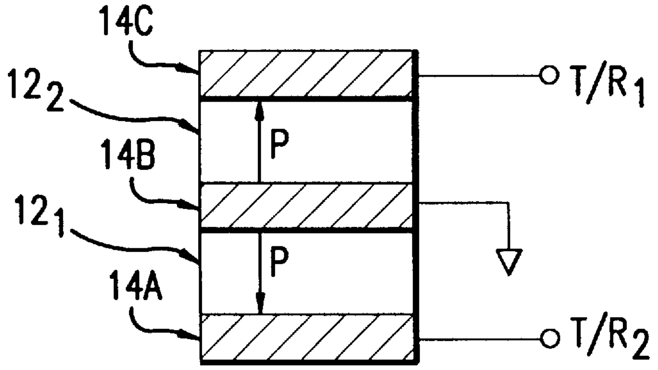
FIG. 6 illustrates an alternate embodiment for the second harmonic imaging transducer.

FIG. 6 illustrates a second harmonic imaging transducer that uses the ultrasound system for switching between the two frequencies. In this embodiment, separate transmit/receive lines T/R1, T/R2 are connected to the upper and lower electrical contact layers 14A, 14C, and the middle electrical contact layer 14B is grounded. The transmit signals on the two transmit/receive lines T/R1, T/R2 are identical, so symmetric mode vibrations are excited in the transducer resulting in transmit frequency F1. On receive, echoes at frequency F1 result in symmetric mode vibrations that produce identical voltages on the upper and lower electrical contact layers, while echoes at frequency F2 result in anti-symmetric mode vibrations that produce equal but opposite polarity voltages on the contact layers. In the receive beamformer of the ultrasound system, the signals on the two lines may be subtracted from each other. This will cause suppression of the signals at F1 but enhancement of the signals at F2. It will now be readily apparent that operation at a single frequency F1 or F2 or any frequency intermediate between F1 and F2 is possible by appropriate timing of the transmit and receive signals on the two transmit/receive lines.

Figure 7A:
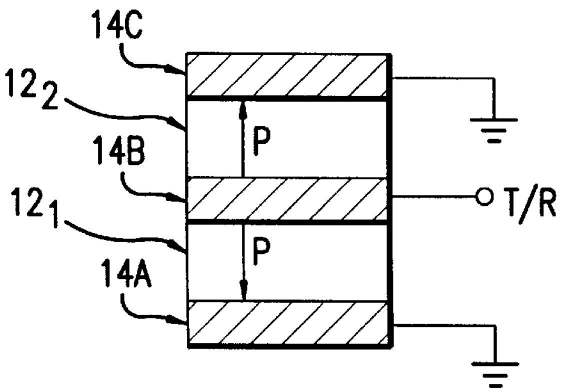
FIGS. 7A–B illustrate an alternate embodiment for the second harmonic imaging transducer.
Figure 7B:
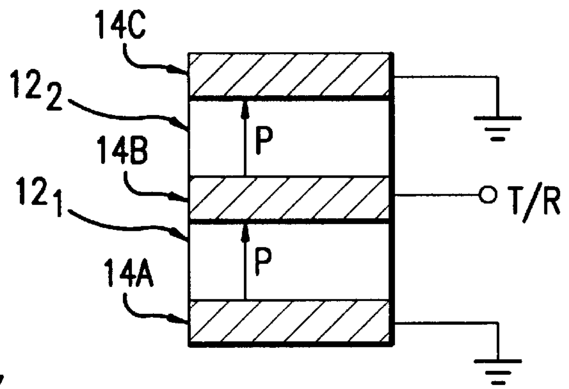

FIGS. 7A–B illustrate elements which although mechanically identical, are polarized in such a way as to be separately optimized for operation at either F1 or F2. In both elements, the signal line is connected to the middle electrical contact layer, and the upper and lower electrical layers are grounded.

In FIG. 7A, the polarization vectors in the two piezoelectric layers are directed oppositely. This structure piezoelectrically couples only the symmetric mode vibrations, and therefore operates at frequency F1. In FIG. 7B, the polarization vectors are oriented in the same direction. This structure piezoelectrically couples only to anti-symmetric mode vibrations, and therefore operates at frequency F2. Now for a second harmonic imaging transducer, a portion of the elements may be polarized for operation at F1, and the remainder of the elements polarized for operation at F2. These elements may be disposed in various patterns in the transducer. For example, the transducer may be divided into two contiguous sections in either the x or y directions, as shown in FIG. 1, each section comprising only elements of the same polarization. Alternatively, the two types of elements may be interleaved, alternating between the two types. This is somewhat more difficult to fabricate, but the transducer will have coincident transmit and receive beams.

Figure 8A:
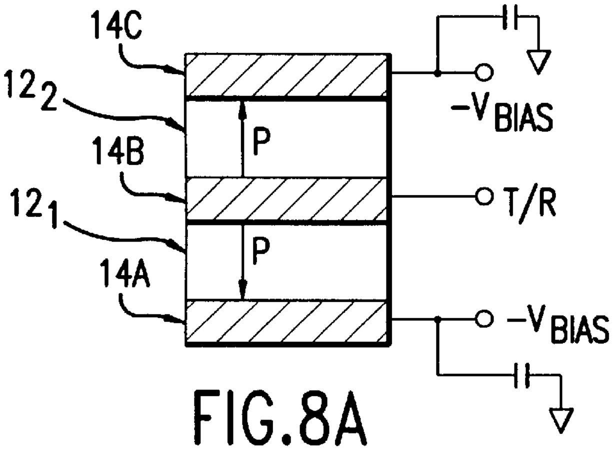
FIGS. 8A–8B illustrate an alternate embodiment for the second harmonic imaging transducer.
Figure 8B:
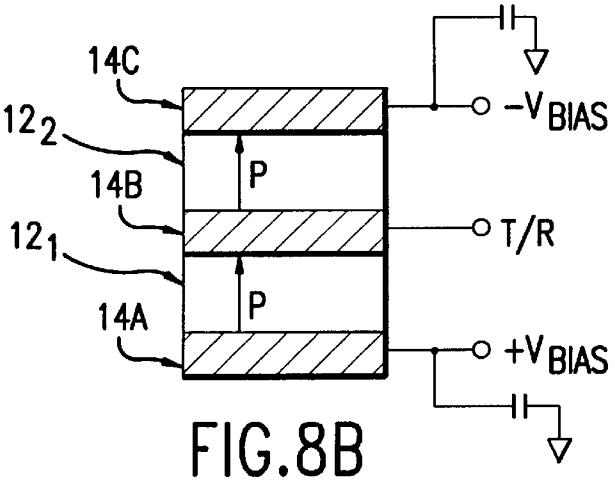

In an alternative embodiment shown in FIGS. 8A and 8B, one or both of the piezoelectric layers may be replaced by an electrostrictive material. This type of material exhibits the property that it is highly polarizable by a D.C. bias voltage, thereby exhibiting piezoelectric properties. The piezoelectric properties persist only as long as the D.C. bias voltage is applied, and the orientation of the polarization depends on the polarity of the bias voltage. The RF signal is capacitively coupled to ground. Thus, by appropriate application of bias voltages, elements of either the types shown in FIGS. 7A–B may be made. FIG. 8A corresponds to FIG. 7A and FIG. 8B corresponds to FIG. 7B. These elements may be disposed in various patterns as described above. In addition, all of the elements may be polarized in the same direction when it is desired to operate the transducer in a conventional imaging mode at either F1 or F2 as described by Guraraja (U.S. Pat. No. 5,410,205).

We claim:

1. A piezoelectric transducer, being operative at two distinct frequencies, comprising:

a piezoelectric arrangement, having a first and a second electrode, including, a series of N piezoelectric layers extending from the first to the second electrode, and a plurality of interleaving electrodes, each of which is located between adjacent piezoelectric layers;

a transceiving line, electrically connected to the piezoelectric arrangement, to at least one of the plurality of interleaving electrodes; and two diodes, connected in parallel with opposite polarity between the first electrode and ground, being operative to switch between the two distinct frequencies.

2. A piezoelectric transducer, being operative at two distinct frequencies, comprising:

a piezoelectric arrangement, having a first and a second electrode, including, a series of N piezoelectric layers extending from the first to the second electrode, and a plurality of interleaving electrodes each of which is located between adjacent piezoelectric layers, at least one of the plurality being connected to ground;

a transceiving line, being electrically connected to the second electrode; and two diodes, connected in parallel with opposite polarity between the first and the second electrodes, being operative to switch between the two distinct frequencies.

3. A transducer, as defined in claim 2, further comprising:

an amplifier, connecting to the first and second electrodes, having an output;

a second pair of diodes, connected in parallel with opposite polarity, connecting to the first electrode and the output; and the transceiving line connecting to the output.

4. A piezoelectric transducer, being operative at two distinct frequencies, comprising:

a piezoelectric arrangements having a first and a second electrode electrically connected to ground, comprising, a series of N piezoelectric layers extending from the first to the second electrode, a plurality of interleaving electrodes, each of which is located between adjacent piezoelectric layers, and, an electrically insulating layer between two adjacent interleaving electrodes;

a transceiving line, being electrically connected to one of the two adjacent interleaving electrodes;

two diodes connected with opposite polarity, being operative to switch between the two distinct frequencies, electrically connected to the piezoelectric arrangement.

5. A piezoelectric transducer, being operative at two distinct frequencies, comprising:

a piezoelectric arrangement, having a first and a second electrode electrically connected to ground, including:

a series of N piezoelectric layers extending from the first to the second electrode, a plurality of interleaving electrodes, each of which is located between adjacent piezoelectric layers, a semi-conductive layer forming an array of diode pairs between two adjacent interleaving electrodes, each pair of diodes being connected parallel with opposite polarity;

a transceiving line being connected to one of the two adjacent interleaving electrodes; and wherein the array of diodes is operative to switch between the two distinct frequencies, electrically connected to the piezoelectric arrangement.

6. A piezoelectric transducer, being operative at two distinct frequencies, comprising:

a piezoelectric arrangement, having a first and a second electrode including:

a series of N piezoelectric layers extending from the first to the second electrode, and a plurality of interleaving electrodes, each of which is located between adjacent piezoelectric layers;

a transceiving line electrically connected to the piezoelectric arrangement;

a first switch, being operative to switch between the two distinct frequencies, electrically connected to the piezoelectric arrangement; and a transformer having a first winding, a second winding, and a center tap, connecting to the piezoelectric arrangement, being operative to increase the frequency selectivity.

7. A transducer, as defined in claim 6, further comprising:

the first and the second electrodes connecting to the first winding of the transformer;

one of the interleaving electrodes is connected to ground;

the first switch, connecting between the transceiving line and the center tap; and a second switch, connecting between the transceiving line and the second winding.

8. A transducer, as defined in claim 6, wherein:

the transformer has a turns ratio of 1:1;

the first winding is connected between the transceiving line and the first electrode;

the second winding is connected between the second electrode and ground such that current flowing out of the second electrode flows through the transformer in the same direction as current into the first electrode;

a second switch, connecting to one of the interleaving electrodes, being operative to turn the one of the interleaving electrodes off during transmit and on during receive;

two pairs of diodes, each pair of diodes connected in parallel with opposite polarity, each pair of diodes connected to a corresponding one of the first and second windings.

* * * * *